US009315618B2

(12) United States Patent
Kim et al.

(10) Patent No.: US 9,315,618 B2
(45) Date of Patent: Apr. 19, 2016

(54) COMPOSITIONS FOR DIRECTED ALIGNMENT OF CONJUGATED POLYMERS

(71) Applicant: The Regents of The University of Michigan, Ann Arbor, MI (US)

(72) Inventors: Jinsang Kim, Ann Arbor, MI (US); Bong-Gi Kim, Ann Arbor, MI (US); Eun Jeong Jeong, Ann Arbor, MI (US)

(73) Assignee: The Regents Of The University Of Michigan, Ann Arbor, MI (US)

( * ) Notice: Subject to any disclaimer, the term of this patent is extended or adjusted under 35 U.S.C. 154(b) by 20 days.

(21) Appl. No.: 14/212,729

(22) Filed: Mar. 14, 2014

(65) Prior Publication Data

US 2015/0011721 A1    Jan. 8, 2015

Related U.S. Application Data

(60) Provisional application No. 61/787,114, filed on Mar. 15, 2013.

(51) Int. Cl.
*C08G 61/12* (2006.01)
*H01L 51/00* (2006.01)
*H01L 51/05* (2006.01)

(52) U.S. Cl.
CPC .......... *C08G 61/126* (2013.01); *H01L 51/0036* (2013.01); *C08G 2261/12* (2013.01); *C08G 2261/146* (2013.01); *C08G 2261/18* (2013.01); *C08G 2261/344* (2013.01); *C08G 2261/91* (2013.01); *C08G 2261/94* (2013.01); *C08G 2261/95* (2013.01); *H01L 51/0558* (2013.01)

(58) Field of Classification Search
CPC ............. C08G 61/126; C08G 2261/12; C08G 2261/18; C08G 2261/91; C08G 2261/94; C08G 2261/95; C08G 2261/146; H01L 51/0043
See application file for complete search history.

(56) References Cited

U.S. PATENT DOCUMENTS 7,767,785 B2 * 8/2010 Falcou et al. ............... 528/423

FOREIGN PATENT DOCUMENTS

CN        102816302 A   * 12/2012
CN        102827357 A   * 12/2012

OTHER PUBLICATIONS

Zhang, Y., et al., "Increased open circuit voltage in fluorinated benzothiadiazole-based alternating conjugated polymers," Chem. Commun., 2011, 47, 11026-11028.*
Kim, B.G., et al., "A molecular design principle of lyotropic liquidcrystalline conjugated polymers with directed alignment capability for plastic electronics," Nature Mat., 2013, 12, 659-664.*
Machine translation of Chinese language patent document CN102816302A from ProQuest, May 28, 2015.*
Machine translation of Chinese language patent document CN102827357A from ProQuest, May 28, 2015.*

* cited by examiner

*Primary Examiner* — Liam J Heincer
*Assistant Examiner* — Nicholas Hill
(74) *Attorney, Agent, or Firm* — Harness, Dickey & Pierce, PLC

(57) ABSTRACT

Conjugated polymers (CPs) achieve directed alignment along an applied flow field and a dichroic ratio of as high as 16.67 in emission from well-aligned thin films and fully realized anisotropic optoelectronic properties of CPs in field-effect transistor (FET).

Figure 1:
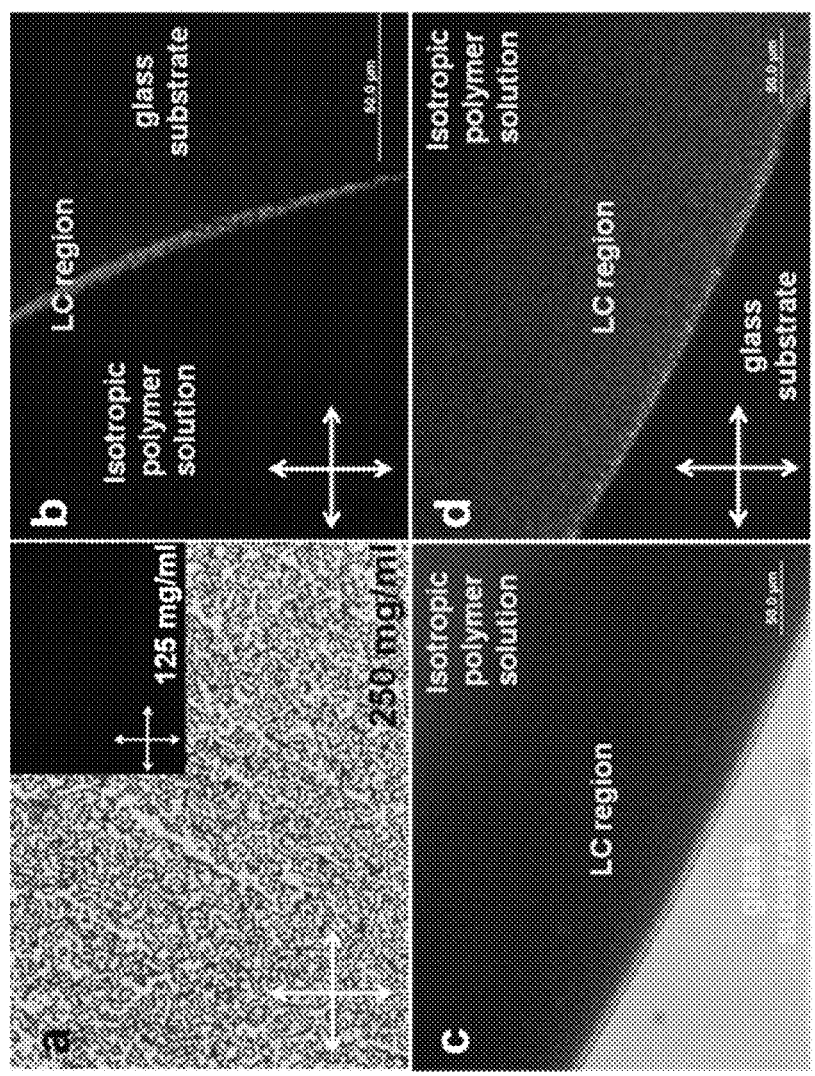

20 Claims, 11 Drawing Sheets
(11 of 11 Drawing Sheet(s) Filed in Color)

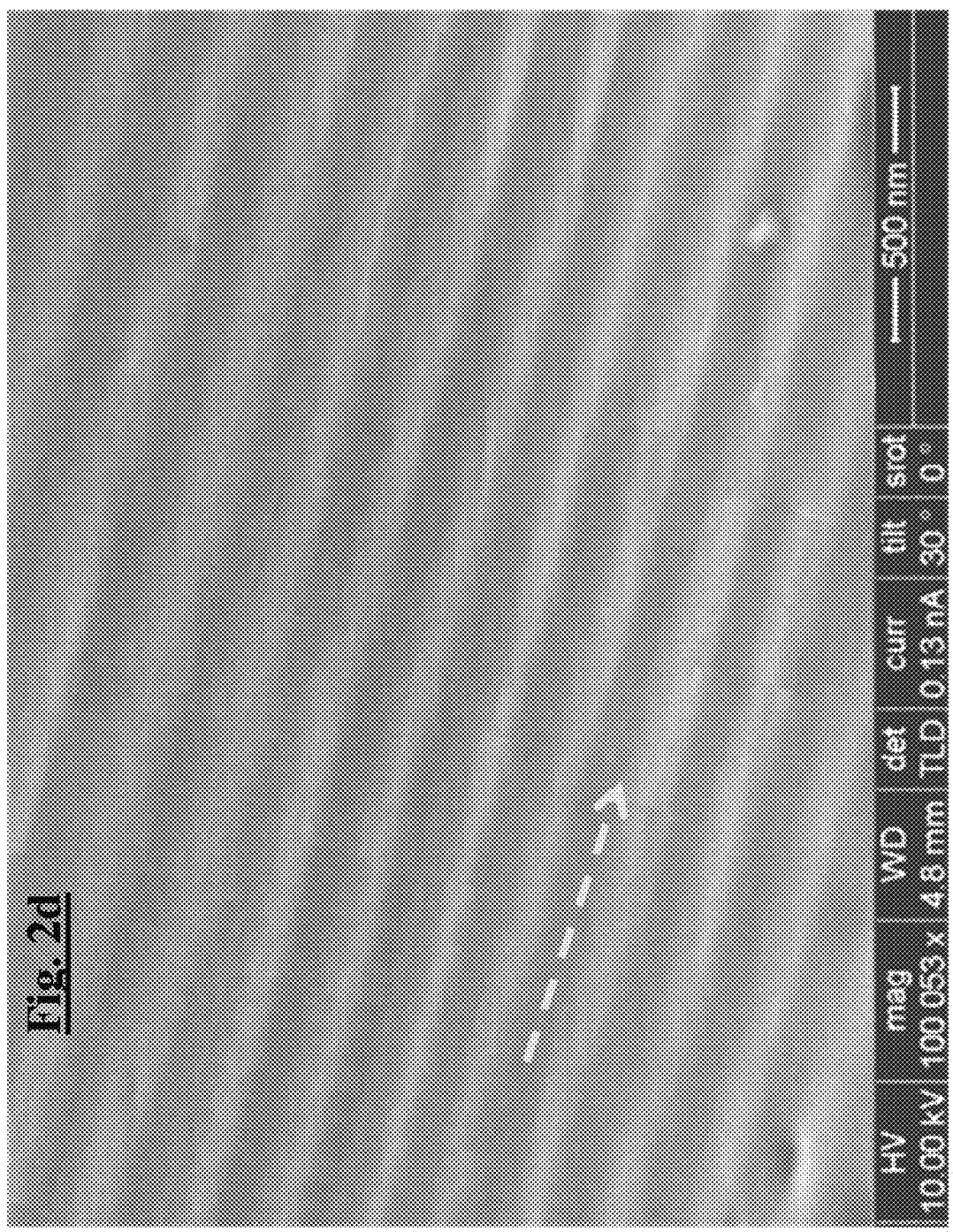

COMPOSITIONS FOR DIRECTED ALIGNMENT OF CONJUGATED POLYMERS

CROSS-REFERENCE TO RELATED APPLICATIONS

This application claims the benefit of U.S. Provisional No. 61/787,114, filed on Mar. 15, 2013. The disclosures of the above application are incorporated herein by reference.

GOVERNMENT INTEREST

This invention was made with government support under DE-SC0000957 awarded by the Department of Energy. The Government has certain rights in the invention.

INTRODUCTION

Conjugated polymers are emerging active materials for various optoelectronic applications, such as organic solar cells, thin film transistors, light emitting diodes, as well as optical and amperometric sensors.[1-10] Their optical and electronic properties, such as absorption, emission, and conductivity, are highly anisotropic due to the 1-dimensional p-orbital overlap along the conjugated polymer backbone. In consequence, unless conjugated polymers are molecularly and macroscopically assembled and aligned with a well-defined structure, their interesting properties cannot be fully realized in their device applications.

A commonly used effective method to create macroscopic alignment is to uniformly expose a rigid body having a high aspect ratio to a flow field, just as molecular liquid crystals (LCs) preferentially orient to an applied shear force.[11-13] Secondary interactions, such as aromatic $\pi$-$\pi$ interaction and hydrogen bonding, have been proposed as a promising tool to modulate CPs' self-assembly and possible alignment when they are rationally incorporated into a molecular design.[1,14,15]

In reality, however, the directed assembly and particularly macroscopic alignment of CPs is a challenging task. In solution CPs usually do not have a planar structure due to the low rotational energy barrier along the conjugated backbone. Therefore, in spite of their rigid rod-like molecular structure, CPs do not have good self-organization unless they are concentrated.

Individual polymer chains in solution cannot be aligned along a flow field, likely because of their small size and tumbling. However, in a condensed solution CPs aggregated and once CPs form crystalline domains, the reduced aspect ratio and low mobility of the crystallized domain will make CPs' alignment along an external flow field unfavorable. Nevertheless, there have been efforts to align conjugated polymers by applying an external force.

The Langmuir-Blodgett film transfer method has been used to align rod-like CPs.[16-17] However, the alignment of the CP by this method is only mediocre, which is likely due to the formation of large-size assembled CP domains at the air water interface and the relatively weak driving force. By this method, the dichroic ratio of 5.0-6.3 was obtained; i.e, the absorption intensity parallel to the alignment direction was 5.0-6.3 times larger than that perpendicular to the alignment direction.

Uniaxial tensile drawing of a CP within an ultrahigh molecular weight polyethylene matrix has been used to achieve a dichroic ratio of 15 in absorption and 20 in emission, respectively.[18-19] However, the application of the highly oriented CPs achieved by this method is limited to polarized photoluminescence because the CPs are imbedded in the insulating polyethylene matrix.

Dip coating of CPs on a substrate has also been investigated as an aligning method.[20] The dichroic ratio was not directly investigated but the hole mobility of the resulting film along the dipping direction was measured to be 2-3 times faster than that perpendicular to the dipping direction. Nanoimprinting was also applied to two different CPs to achieve alignment by means of nanoconfinement.[21] The thermotropic liquid-crystalline CP showed a dichroic ratio of 12 in emission but the other CP did not show any alignment. The authors concluded that the lack of packing prevented CP from assembly and alignment but did not investigate detailed molecular design requirements. Even though these methods provide a certain degree of CP alignment, in order to fully utilize CPs' anisotropic electronic and optical properties, a molecular design principle of CPs combined with an efficient directed aligning strategy should be devised so that aligned thin conducting CPs layers and lines can be fabricated directly on a substrate.

ABSTRACT

A molecular design principle of CPs having intramolecular S-F interaction and bulky side chains linked to a tetrahedral carbon having a large form factor is established to achieve concentration-regulated chain planarization, self-assembly, liquid crystal-like good mobility, non-interdigitated side chains, and ensuing chain alignment along an applied flow field. By optimizing the polymer concentration and a flow field, a high dichroic ratio of 16.67 can be achieved from conducting CP films. 2-D grazing incidence X-ray diffraction shows a well-defined CP alignment. Thin film transistors built on highly aligned CP films showed more than three orders of magnitude faster carrier mobility along the CP alignment direction than the perpendicular to the CP alignment direction, and an anisotropic optical gating effect depending on a polarized light direction.

In this contribution, we systematically investigated and established a molecular design principle of CPs to achieve directed alignment of CPs along an applied flow field and achieve a dichroic ratio of as high as 16.67 in emission from well-aligned conducting CP thin films and fully realized anisotropic optoelectronic properties of CPs in field-effect transistor (FET). As shown in Scheme S1 and Scheme S2, four different CPs sharing the same chemical backbone were synthesized. CPI shows the inventive features described herein, while CP2, CP3, CP4 are comparative.

DRAWINGS

The patent or application file contains at least one drawing executed in color. Copies of this patent or patent application publication with color drawing(s) will be provided by the Office upon request and payment of the necessary fee. The drawings described herein are for illustrative purposes only of selected embodiments and not all possible implementations, and are not intended to limit the scope of the present disclosure.

FIG. 1 shows concentration dependent liquid crystalline (LC) behavior of CP1 solution. Highly concentrated CP1 solution (250 mg/ml) exhibited a birefringent texture under crossed polarizer (a), and CP1 solution (125 mg/ml) produced the birefringent texture only around the solution edge as the solvent evaporates and the solvent evaporation front recedes within sandwiched cell (b-d, c is a bright field image and d is a dark field image).

FIG. 2 shows generated grooves and their morphology analysis. Optical microscopic images of the obtained groove from without (a) and with additive (b). Fluorescent microscope image (c) was taken at the same position with (B) and insets are magnified grooves (35 μm). The SEM (d) and AFM (e) measurements reveals that generated grooves have regular feature of 5 nm in amplitude and of 200-300 nm in periodicity. (f) AFM section analysis profile of the left image in FIG. 2(e) along the black solid line. The two triangles in FIGS. 2(e) and 2(f) indicate the same positions in the two figures.

Figure 3:
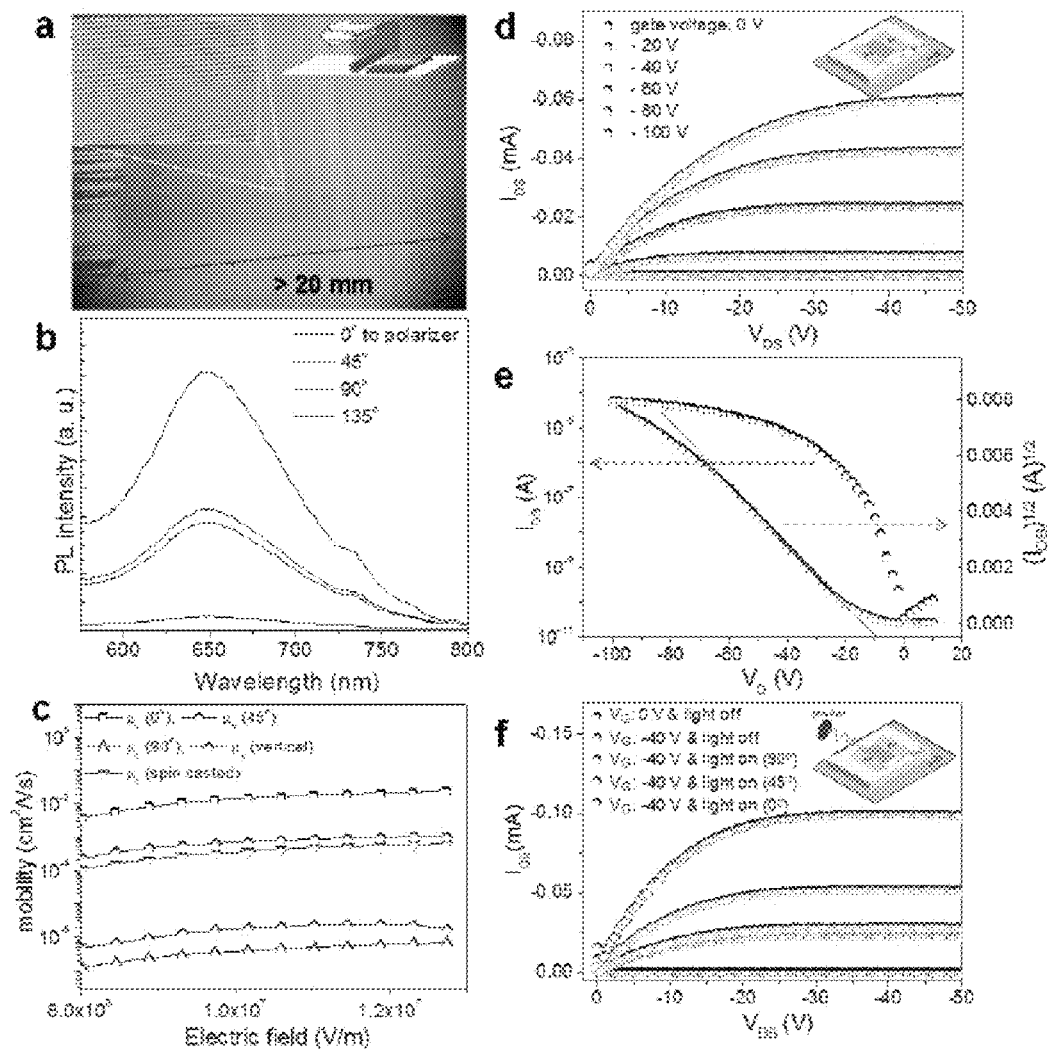

FIG. 3 shows directed alignment and its optical/electrical anisotropic properties. A contact coating method (a) was applied to manipulate the alignment direction and the degree of alignment was characterized based on the dichroic ratio (b). The anisotropic electrical property of the aligned CP1 film was characterized with an FET device (c-e) and an optical gating effect under both an electrical voltage and a polarized light was demonstrated (f). Insets show the geometry of the device and the orientation of the electrodes relative to the alignment direction of CP1 depicted as the arrow.

Figure 4:
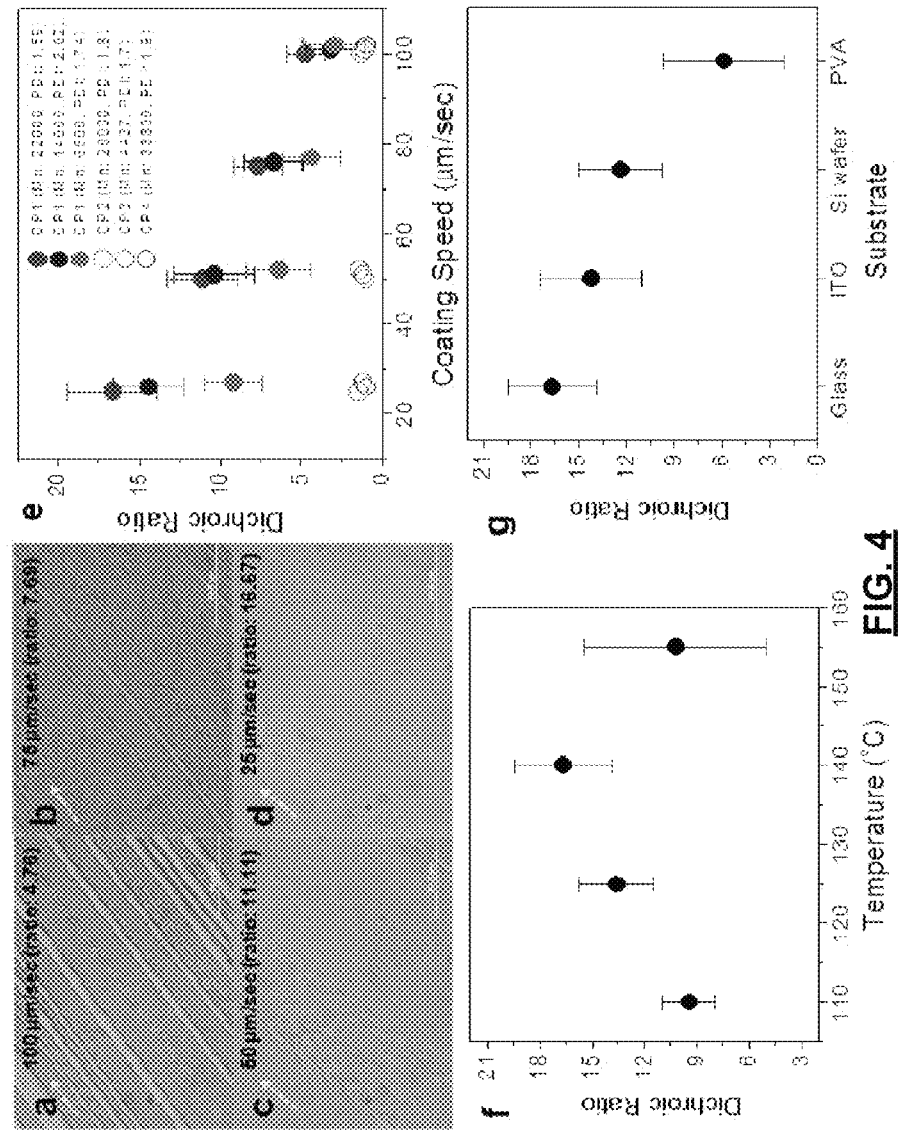

FIG. 4 shows the degree of chain alignment in CP1 characterized by means of contact coating method under different coating speed. As coating speed decrease from 100 μm/sec (a) to 25 μm/sec (d), the groove is getting uniform and smaller, which is comparable with better alignment. The value in parenthesis (a-d, Mn: 22000) indicating the dichroic ratio of emission intensity between parallel and perpendicular direction of polarizer to the groove direction was improved as CP1's molecular weight increased (e). The maximum dichroic ratio was obtained at 140° C. (f) onto glass substrate (g, 140° C.) when CP1 (Mn: 22000) solution was contact-casted with 25 μm/sec.

Figure 5:
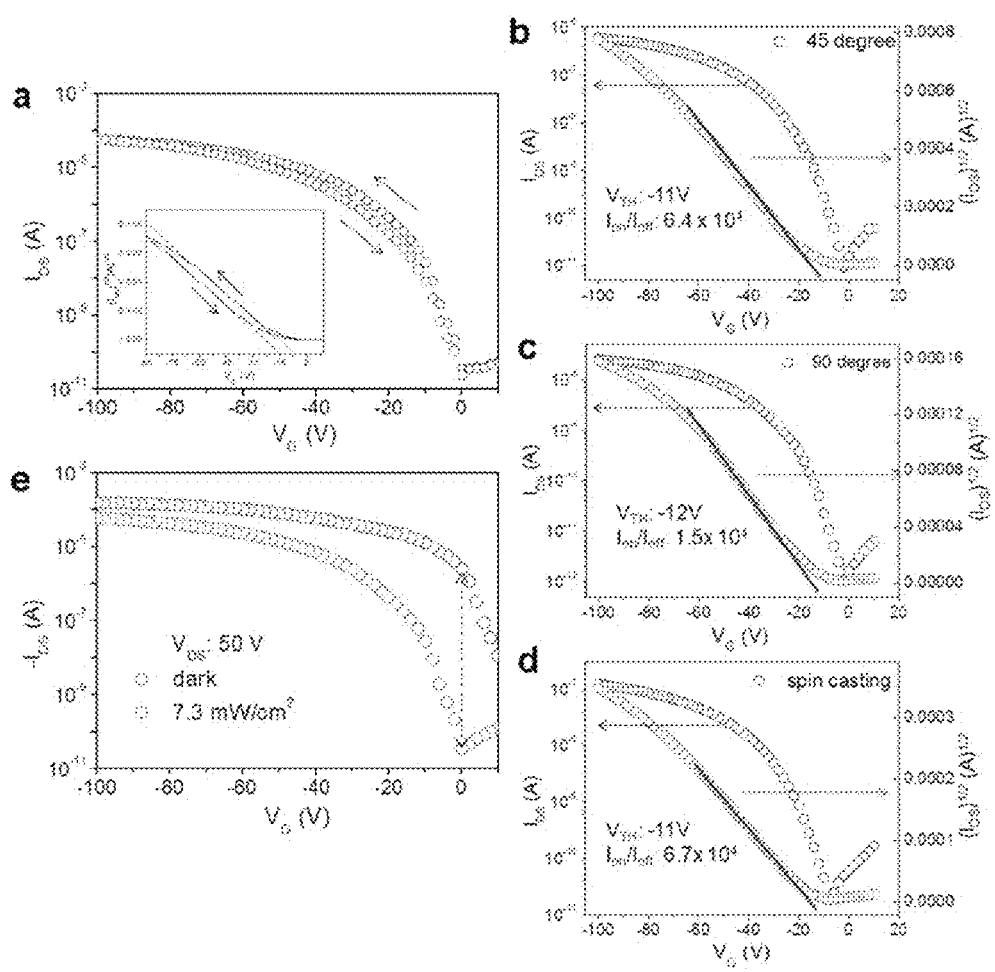

FIG. 5 shows the hysteresis behavior of FET device built on an aligned CP1 film was characterized, and only small gate voltage difference (5.0 V) was noticed along the polymer alignment direction (a). Transfer curves showed that the transverse direction of carrier transfer compared to the aligned polymer chain direction (c) is much smaller than those of midway direction (b) or spin cast film (d). As a photo transistor, the obtained device exhibited a high on/off radio ($7.2 \times 10^4$, black broken arrow) under polarized light source (e).

Figure 6:
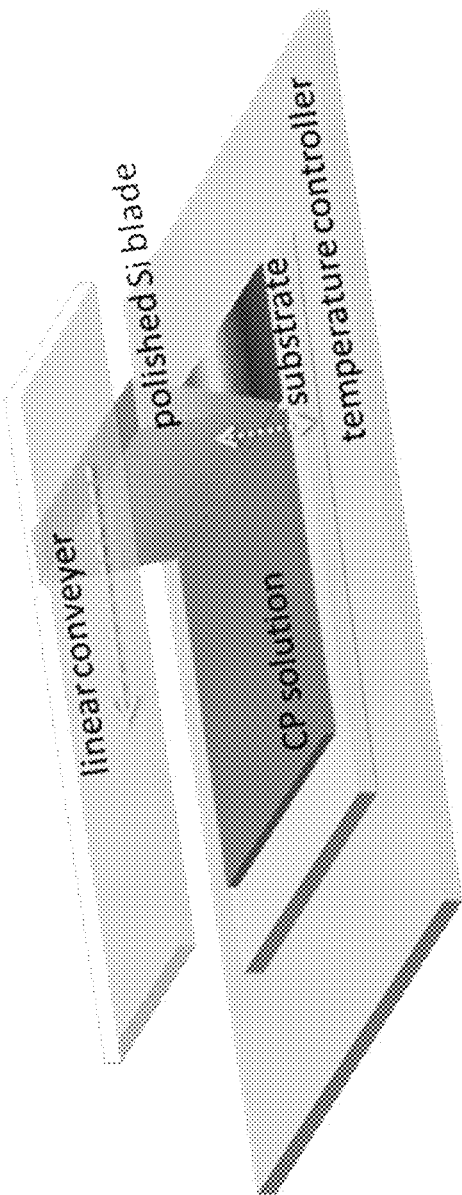

FIG. 6 shows a schematic illustration of contact type coater. The blade was fabricated with polished Si wafer, the substrate temperature was controlled by heating stage (temperature controller) and the coating speed was regulated by a linear type conveyer (1 μm/sec to 1 cm/sec).

DESCRIPTION

In one embodiment, a conductive polymer having an aromatic repeating unit is provided. The repeating unit comprises:
a) an aromatic π-conjugated backbone comprising a plurality of aromatic rings, and further comprising at least one sulfur atom and at least one fluorine atom, the sulfur and fluorine atoms being located on adjacent aromatic rings and separated by three carbon atoms of the π-conjugated backbone;
b) an aliphatic ring fused to at least one of the aromatic rings of the repeating unit; and
c) two side chains connected to an sp³ carbon of the fused aliphatic ring,
wherein the side chains are aliphatic and have 4 or more non-hydrogen atoms.

In various embodiments, the conjugated backbone comprises at least one thiophene ring, the conjugated backbone comprises at least one aryl ring, or the conjugated backbone comprises 2-6 aromatic rings. For example the repeating unit comprises a conjugated backbone with 3 aromatic rings or with 4 aromatic rings. In certain embodiments, the conjugated backbone comprises a F-substituted phenyl ring and can further comprise a thiophene ring.

In illustrative embodiments, the side chains are independently selected from $C_4$-$C_{20}$ alkyl; $C_4$-$C_{20}$ alkyl substituted with one or more groups selected from oxo, oxa, and hydroxyl; $C_4$-$C_{20}$ alkenyl, $C_4$-$C_{20}$ alkenyl substituted with one or more groups selected from oxo, oxa, and hydroxyl; $C_4$-$C_{20}$ alkynyl; and $C_4$-$C_{20}$ alkynyl substituted with one or more groups selected from oxo, oxa, and hydroxyl.

In further embodiments, the side chains are independently selected from $C_4$-$C_{12}$ alkyl; $C_4$-$C_{12}$ alkyl substituted with one or more groups selected from oxo, oxa, and hydroxyl; $C_4$-$C_{12}$ alkenyl; $C_4$-$C_{12}$ alkenyl substituted with one or more groups selected from oxo, oxa, and hydroxyl; $C_4$-$C_{12}$ alkynyl; and $C_4$-$C_{12}$ alkynyl substituted with one or more groups selected from oxo, oxa, and hydroxyl.

In a particular embodiment, the conjugated backbone comprises two thiophene rings and a phenyl ring substituted with two F atoms.

The conductive polymer is characterized as having an intramolecular sulfur-fluorine (S-F) interaction and "bulky" side chains linked to a tetrahedral carbon atom. The structural features lead to concentration-regulated chain planarization, self-assembly, non-interdigitated side chains, and chain alignment along an applied flow field.

In another embodiment, a conductive polymer having the above features has a repeating unit of the structure

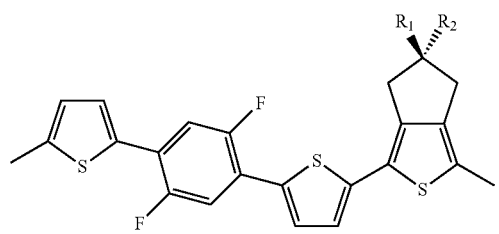

wherein R1 and R2 are aliphatic groups containing 4 or more non-hydrogen atoms.

In various embodiments, $R_1$ and $R_2$ are independently selected from $C_4$-$C_{20}$ alkyl, $C_4$-$C_{20}$ alkyl substituted with one or more groups selected from oxo, oxa, and hydroxyl; $C_4$-$C_{20}$ alkenyl, $C_4$-$C_{20}$ alkenyl substituted with one or more groups selected from oxo, oxa, and hydroxyl; $C_4$-$C_{20}$ alkynyl, $C_4$-$C_{20}$ alkynyl substituted with one or more groups selected from oxo, oxa, and hydroxyl.

In other embodiments, $R_1$ and $R_2$ are independently selected from $C_4$-$C_{12}$ alkyl; $C_4$-$C_{12}$ alkyl substituted with one or more groups selected from oxo, oxa, and hydroxyl; $C_4$-$C_{12}$ alkenyl; $C_4$-$C_{12}$ alkenyl substituted with one or more groups selected from oxo, oxa, and hydroxyl; $C_4$-$C_{12}$ alkynyl; and $C_4$-$C_{12}$ alkynyl substituted with one or more groups selected from oxo, oxa, and hydroxyl.

In particular embodiments, $R_1$ and $R_2$ are (2-ethylhexyloxy)methyl.

Further non-limiting examples of polymer include those with the following repeat units:

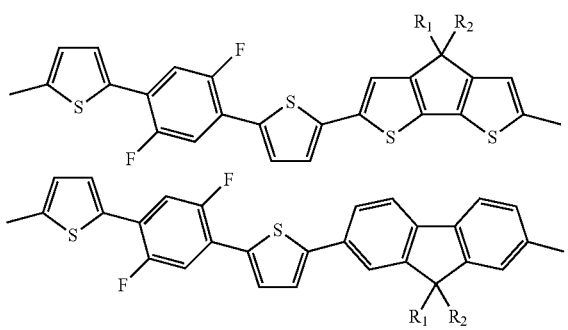

where $R_1$ and $R_2$ are as defined above.

In another embodiment, an electroconductive polymer film is made from any of the polymers. The film in turn can be fabricated into known devices such as a light emitting diode, a field effect transistor, a thin film transistor, an organic solar cell, an optical sensor, and an amperometric sensor.

Design features of the inventive chemical structure of CP1 include (1) concentration induced chain planarization, (2) carbon having tetrahedral out-of-plane bonding, and (3) bulky side chains preventing side chain interdigitation. The difference between CP1 and CP2 is the two fluorine (F) atoms on the benzene moiety in CP1, which was designed to investigate the influence of the S-F interaction on the intra-molecular geometry and ultimately as a means to regulate chain planarity. The interaction between S and F atoms has been reported to improve carrier mobility because it is strong enough to enhance the crystallinity of small molecules.[22-23] To minimize intermolecular S-F interaction and massive polymer aggregation induced by strong intermolecular π-π interactions, two bulky 2-ethylhexyl side chains were introduced at the tetrahedral position of the second repeat unit of CP1. The second repeat unit having this unique structural form factor provides a liquid crystal-like property to CP1 by not only preventing the polymer from massive aggregation and but also inhibiting side chain interdigitation (FIG. 1).

In order to investigate the role of the bulky side chains and the necessity of the tetrahedral carbon having out-of-plane bonds, the third CP (CP3) and the fourth CP (CP4) were designed and synthesized, respectively. CP3 shares the exact same chemical structure with CP1 except that it has only one 2-ethylhexyl side chain rather than two bulky side chains. We kept the same two bulky 2-ethylhexyl side chains when we designed CP4 but replaced the tetrahedral carbon linkage having two out-of plane bonds with the nitrogen linkage having one in-plane bond to attach the side chains. The new CPs of Scheme 1 and S2 were synthesized by using Suzuki or Stille type reactions with Pd(0) catalysts.

The resulting CPs have very similar absorption spectra in solution due to their structural similarity. When the chain conformations of the CPs were quantum mechanically calculated by means of the time dependent density functional theory (DFT), the four CPs exhibited analogous chain geometries having similar twist angles between each monomer which explains their similar absorption behavior in solution. Synthetic procedures of obtained polymers and R indicates 2-ethylhexyl group.

Polymer geometry, including twisted angles between each segmental unit, was predicted after calculation of their trimer's chain conformation. In case of CP3, its conformation was assumed as same with CP1 because they share exactly same backbone structure. Electronic structure calculations and spatial relaxation of the molecules were performed by using Gaussian03. Pre-optimizations of the molecules were carried out using AM1 semi-empirical quantum chemistry model and the resulting molecular configurations were then further optimized in the density functional theory (DFT) framework. We used B3LYP as the exchange-correlation functional that is a Hartree-Fock-DFT hybrid where the exchange energy is explicitly calculated using the Hartree-Fock approach. The molecular geometries were optimized in the Cartesian coordinate system without any symmetry (maximum degrees of freedom) using 6-31G* contracted Gaussian basis set with polarization functions.

Figure 2A:
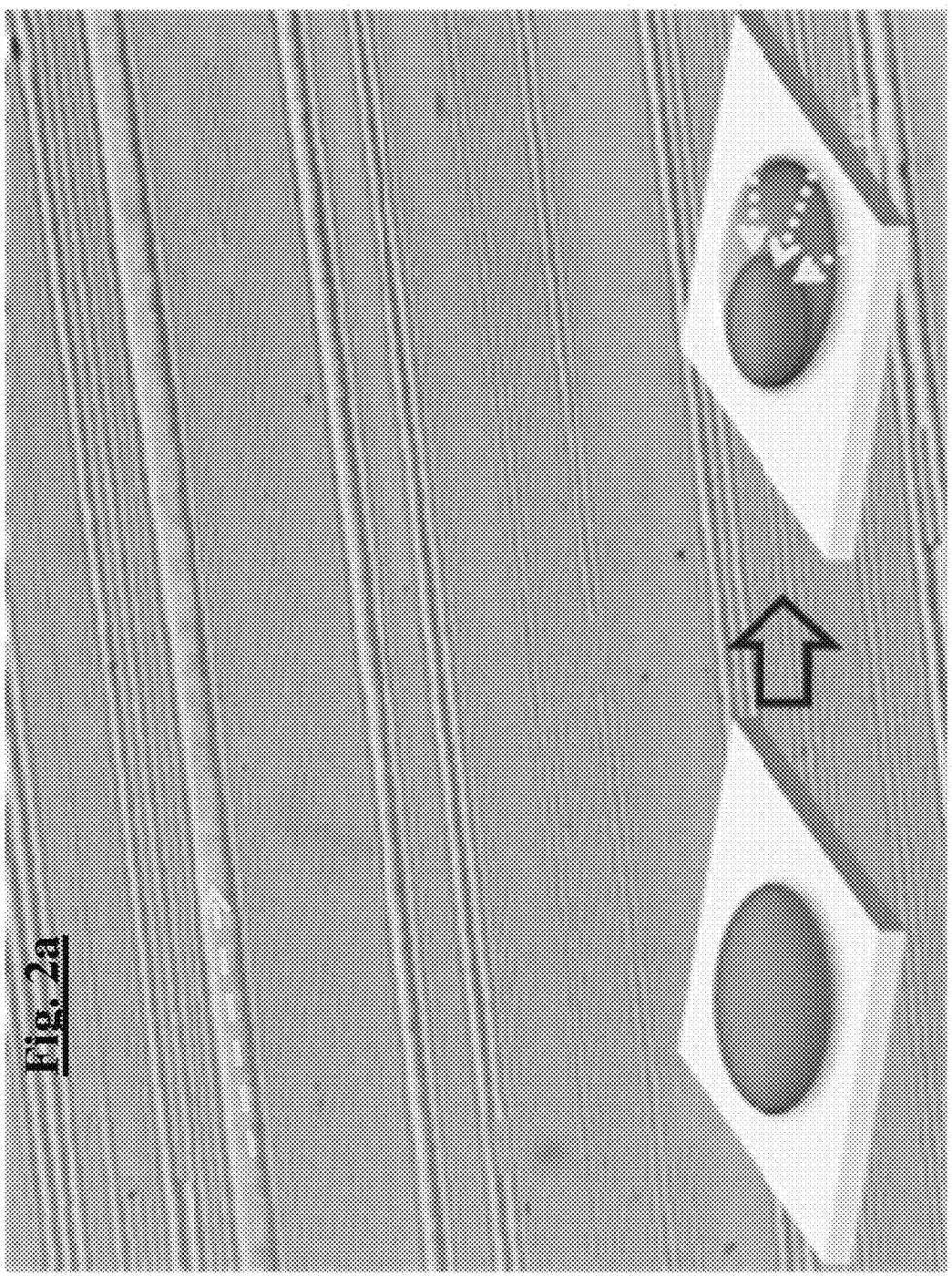
Figure 2H:
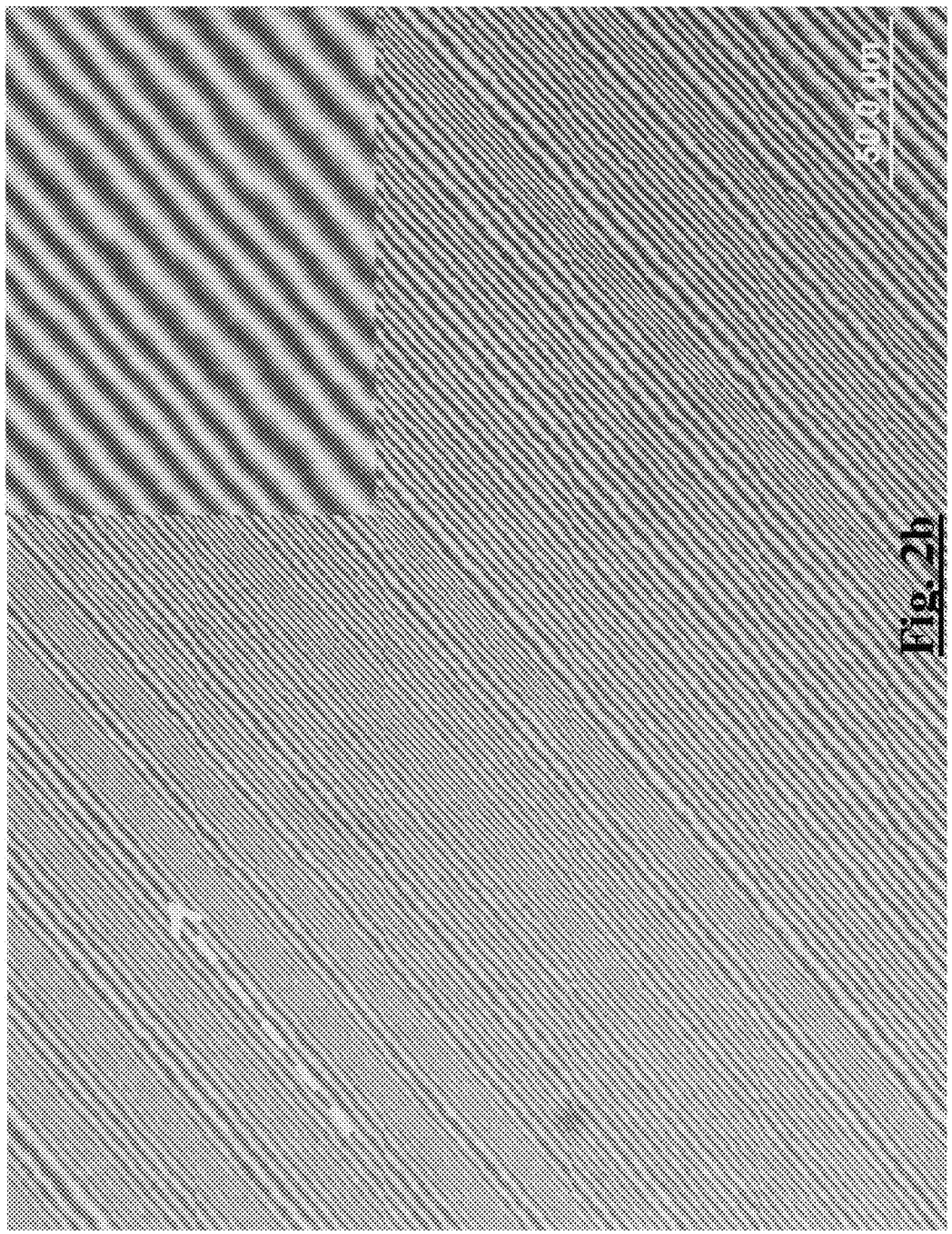
Figure 2C:
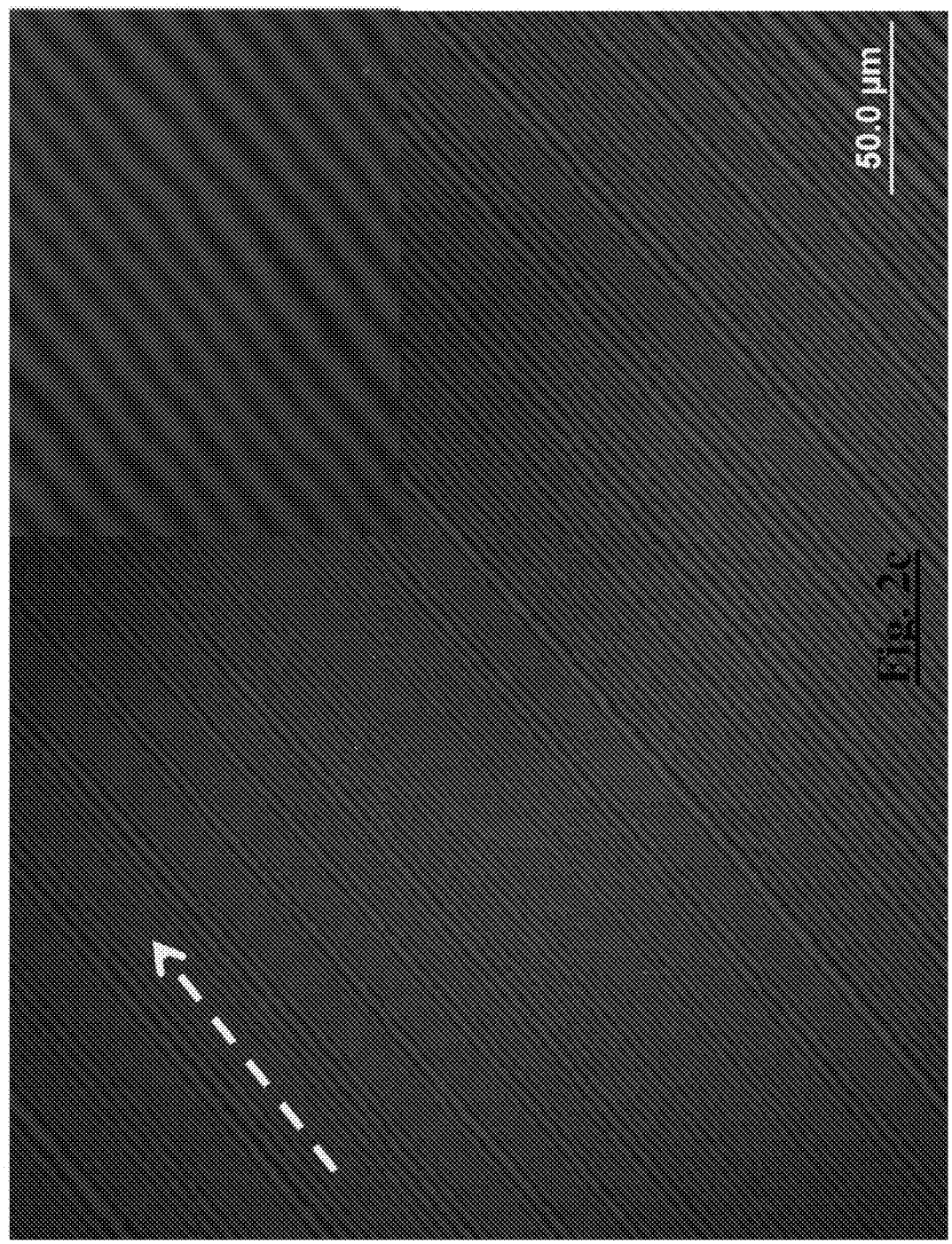
Figure 2E:
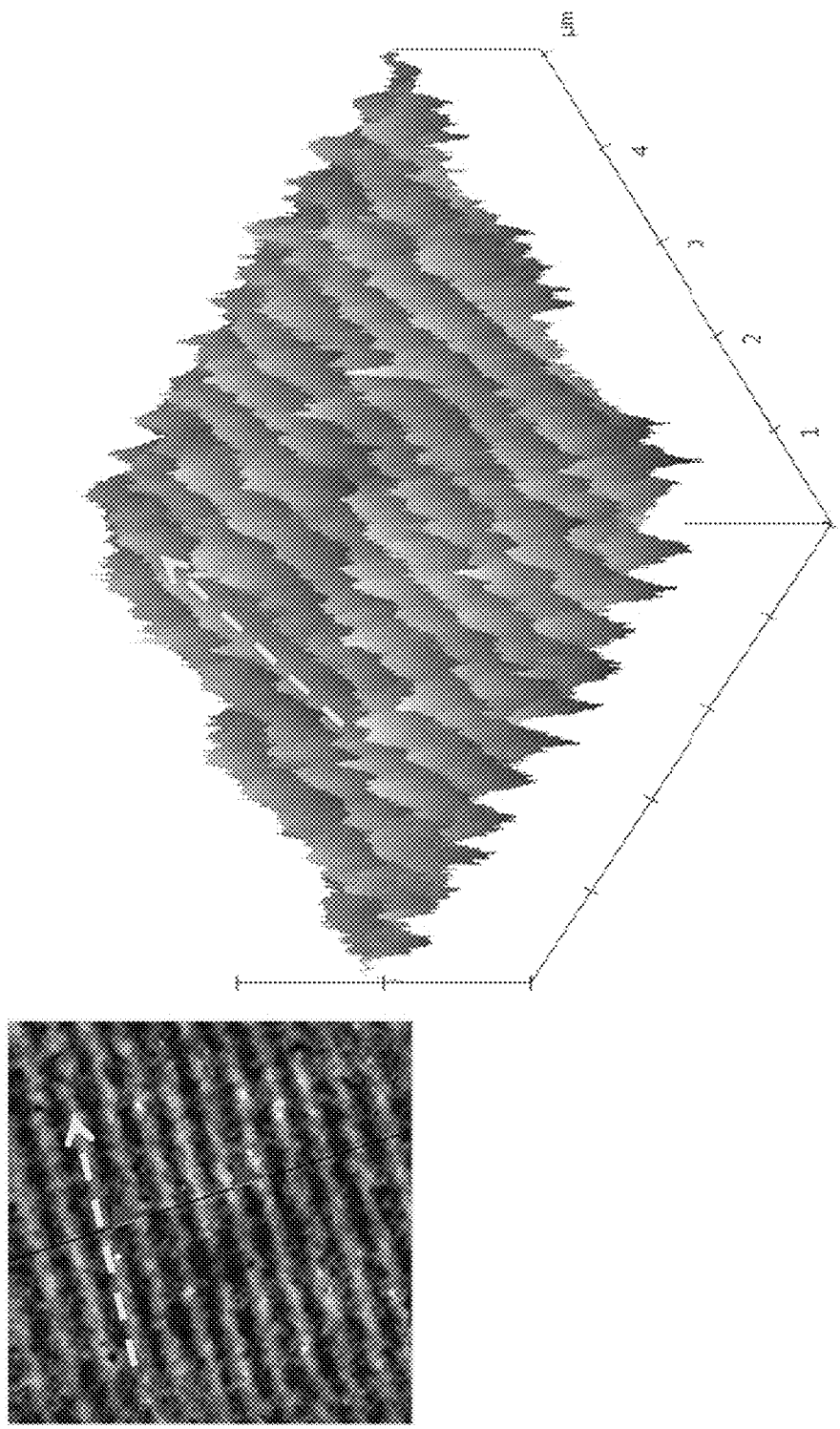
Figure 2F:
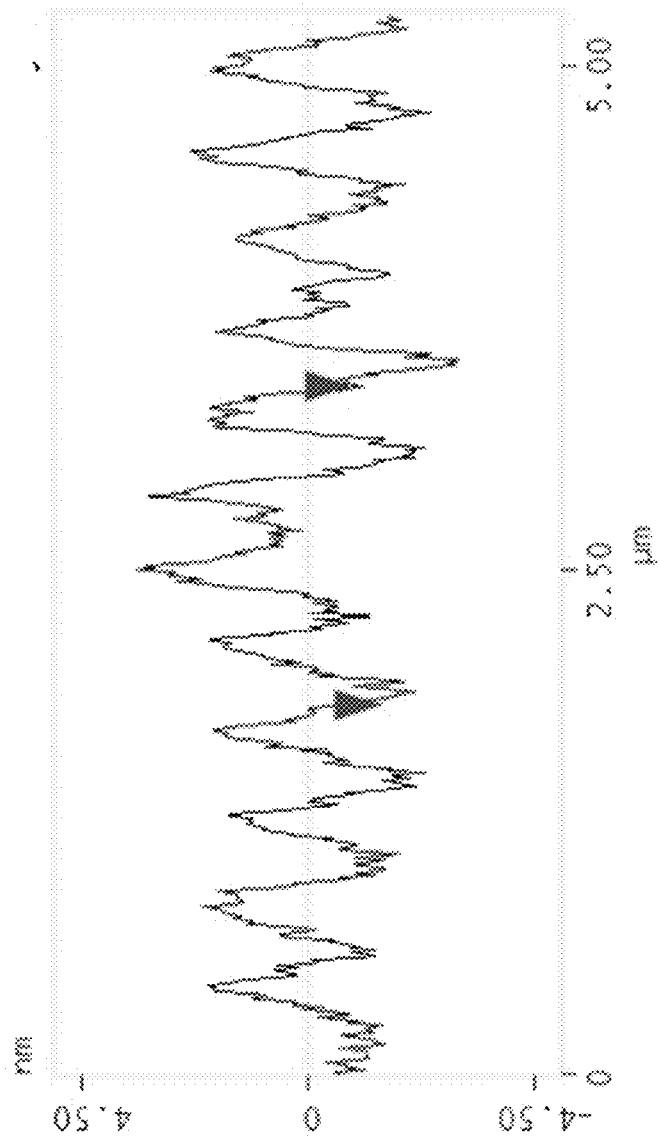

When CP1 solution in o-dichlorobenzene (10 mg/4 ml) is drop-cast on a hydrophilic substrate on a hot plate, such as glass, indium tin oxide (ITO) and polyvinyl alcohol (PVA) film, a flow field forms as the solvent evaporates during thermal treatment. The spontaneous flow field of CP1 can be attributed to its low surface energy originating from the F atoms as confirmed with a water contact angle of 101.5°. Interestingly, the flow of CP1 solution produced unidirectional grooves (FIG. 2a), which have the same direction as the flow. Adding an additive (5 vol %, 1,8-diiodooctane or octanedithiol) to the CP1 solution improved the uniformity of the resulting grooves as shown in FIG. 2b, indicating that the non-volatile additive is helpful for the groove generation mechanism in the CP1 film. The grooves exhibited a bright and dark reddish emission along their direction (FIG. 2c). The Marangoni effect caused by the surface tension difference during solvent evaporation may be responsible in part for the groove formation. High resolution SEM (FIG. 2d) and tapping mode AFM (FIG. 2e) revealed that the grooves have regular features, exhibiting about 5 nm in amplitude and a 200~300 nm period.

To analyze the nature of the grooves, the CP1 film was characterized by grazing incidence X-ray diffraction (GIXD) with a 2-D detector because it provides both lateral and vertical order information of a thin film. The 2-D GIXD measurement was carried out both parallel (in-groove) and perpendicular (out-groove) to the grooves in a single sample. In the case of y-axis scattering, both in-groove and out-groove directions showed the same scattering pattern, corresponding to a lamella-like orientational order, with a similar scattering intensity. Only the in-groove direction, however, exhibited noticeable x-axis scattering, suggesting that the generated lamella have a principal positional order along the flow field direction. An X-ray diffractogram converted from the 2-D scattering images reveals that the inter-chain distance ($2\theta=4.3°$, 20.5 Å) is comparable to double the calculated side chain distance (10.5 Å) of the polymer backbone, as illustrated in FIG. 3d. Although the invention is not limited by theory or mode of action, it appears that the branched bulky side chains (two 2-ethylhexyl groups at the tetrahedral position) have minimized inter-chain interactions, resulting in barely interdigitated CP1 chains.

When a CP1 film was fabricated by spin casting, we could see only an immature lamellar structure without any x-axis scattering, indicating a lack of inter-lamellar ordering; spin casting dries the film rapidly and does not likely allow enough time or mobility for the polymer chains to be self-assembled and oriented. Along these lines, the diffraction images of a spin cast CP1 film and a drop cast CP2 film indicate no noticeable crystallization. The diffraction patterns on CP3 and CP4 obtained by means of Rigaku Rotaflex Ru-200B indicate that CP3 induces strong side chain interdigitation but CP4 does not due to bulky side chains.

CP2, having no intra-molecular S-F interaction capability, did not show any alignment and generated only primary scattering corresponding to the inter-chain distance. The reason for the distinguishable self-assembly behaviors between CP1 and CP2 can be traced to their different molecular geometry which originates from the intra-molecular S-F interaction. Initially, both CPs are fully solvated by a good solvent and have a similar conformation confirmed by their solution UV-vis spectra. During the solvent evaporation the free volume occupied by solvent molecules decreases and the polymer chains reorient to minimize steric hindrance as they are forced to be closely packed. One common type of reorientation routes of CPs is their backbone rotation because of their inherently rigid rod-like frame-work.[24] This rotation triggers the intramolecular S-F interaction and produces planar segments in the CP1 backbone. Then, the planar segments accelerate inter-chain assembly via π-π interaction. However, the bulky side chains attached on the tetrahedral position of the second repeat unit prevent massive aggregation, which gives still mobile crystalline-like nature on the CP1 chains, much like LCs. The UV-vis spectra of CP1 in a solution and a solid film are consistent with this discussion.

The absorption of CP1 shows a large red-shift in a solid film. Usually, a large red-shift of the absorption $\lambda_{max}$ from solution to a film state is explained by strong intermolecular aggregation and/or increased effective conjugation due to chain planarization.[24] Since the bulky 2-ethylhexyloxy side chains were introduced at the tetrahedral position to minimize intermolecular chain packing, the unique and large absorption change of CP1 in a solid film could be ascribed to the chain planarization via the intramolecular S-F interaction. Examining the absorption spectra of CP2 in a solution and a solid film verifies this claim: CP2, having no S-F interaction, capability only showed a minimal red shift from a solution to a solid film.

To investigate the importance of the non-interdigitated side chain packing of CP1 for the directed alignment capability, we synthesized CP3 having only one 2-ethylhexyl side chain. XRD data showed the interchain distance of 1.65 nm, which is much smaller than 2.10 nm of CP1, indicating interdigitated side chains of CP3 as intended. CP3 indeed did not show the alignment phenomenon. We believe that the interdigitated side chains interlock the CP3 chains along the film thickness direction, reduce the chain mobility and the aspect ratio, and consequently prevent the rod-like individual CP3 chain from aligning, while the non-interdigitated bulky side chains of CP1 endow liquid-like mobility to CP1 so that it can align along the shear direction.

To demonstrate how having the two out-of-plane bonds or an analogous moiety having a large form factor seems to be necessary for realizing the directed alignment feature through preventing a strong π-π interchain interaction of CPs, we synthesized CP4 having the same two 2-ethylhexyl side chains connected to a nitrogen linker rather than a tetrahedral carbon linker. XRD analysis on CP4 films showed 2.81 nm of interchain distance, suggesting non-interdigitated side chains like CP1. However, we could not observe any alignment feature from CP4. We investigated the aggregation behavior of CP4 compared to CP1 to understand the importance of the tetrahedral carbon linker. We prepared CP1 and CP4 solutions in o-dichlorobenzene at various concentrations and recorded the absorption spectrums of each solution. While CP1 did not show any significant red shift even at a very high concentration of 135 mg/ml, CP4 displayed aggregation and particle formation at a concentration of only 4 mg/ml. A 4 mg/ml solution of CP4 exhibited a Tyndall effect due to the particle formation. Therefore, we conclude that CP4, lacking a tetrahedral carbon with two out-of-plane linkers, aggregates too well. The aggregates do not have a large enough aspect ratio nor good enough mobility to be aligned along the flow field.

The structural analysis, optical properties, and alignment behavior of the designed four CPs consistently support the molecular design principle recited herein for efficient polymer alignment.

To direct the alignment direction of the CP1 chains, a contact coating system can be used to adjust both the coating speed and the thickness of the film. As shown in FIG. 3a, we obtained a well-aligned CP1 film along the applied contact coating direction. In this system, the blade maintained contact with the CP1 solution through capillary force. As the coating speed decreases, more narrow and homogeneous grooves are produced. The width of the coating area under an optimized coating condition (speed; 25 µm/sec, gap; 50 µm) was over 20 mm. To quantify the alignment of CP1 realized by the contact coating method, the emission intensities of the film were investigated by using a linear polarizer. As depicted in FIG. 3b, the emission intensity decreased as the direction of the polarizer deviated from parallel to perpendicular to the contact coating direction, indicating a parallel alignment of CP1 along the coating direction. As the coating speed decreased, a higher degree of polymer alignment was achieved judging from the dichroic ratio in emission (the emission intensity parallel to the alignment direction/the emission intensity perpendicular to the alignment direction) (FIG. 4). While the film obtained with a 100 µm/sec coating speed exhibited a dichroic ratio of 4.76, the film produced with a 25 µm/sec coating produced a much larger dichroic ratio of 16.67. In a sense, this is counterintuitive because a larger coating speed should produce a large flow field and anticipate better chain alignment. The reason for this counterintuitive phenomenon can be found from the CP1 design for directed alignment. Until the solvent evaporates enough, CP1 will not have a planar conformation and in this state the polymer chain cannot be effectively aligned due to the small size of the individual chain (vide supra); the exact same reason the non-volatile additive improved polymer alignment. Therefore, a slower coating speed will allow more solvent evaporation and induce more effective chain planarization and self-assembly. The self-assembled liquid-like CP1 will then align along the flow field. The molecular weight of CPs will also influence the degree of alignment. We obtained a larger dichroic ratio as the molecular weight of CP1 increased (FIG. 4e). The enlarged molecular weight would endow higher aspect ratio to the rigid frame, resulting in better intermolecular assembly as similarly described in a previous report.[25]

FET Devices

We built FET devices having top-contact and bottom-gate (TC-BG) configuration on the well-aligned CP1 film to demonstrate how the anisotropic properties of CP can be realized in a device application. Heavily doped n-type Si/SiO$_2$ wafer was used as the substrate, wherein the conductive Si wafer and the surface SiO$_2$ layer (~260 nm) function as the common gate electrode and the gate dielectric, respectively. As shown in the output and transfer curves (FIG. 3c-d) of FET device having the same source-drain (S-D) direction to the alignment, the hole mobility (µ(0°)) extracted from the saturation regime is 0.86 cm$^2$/V·s, with a current on-to-off ratio ($I_{on}/I_{off}$) of 1.7×10$^6$ and a threshold voltage ($V_{TH}$) of around −16 V. In addition, the hysteresis characteristic of the FET device obtained from the aligned CP1 film was investigated (FIG. 5a) by sweeping the gate voltage in the forward and reverse directions under a S-D voltage ($V_D$) of −50 V at a sweep rate of 0.5 V/s. The device hysteresis defined as the difference between the forward and reverse threshold voltage is about 5.0 V, which is comparable to that of FET device built on common semiconducting CPs.[26]

The FET carrier mobility sensitively changed depending on the S-D direction relative to the polymer alignment direction (FIG. 4e and FIG. 5b-d). The fastest hole mobility was obtained along the polymer alignment direction ($\mu(0°)=0.86$ cm$^2$/V·s), which was about 3 orders of magnitude higher than the slowest hole mobility extracted from the perpendicular direction to the polymer alignment, $\mu(90°)$ of 0.00054 cm$^2$/V·s. This result indicates that the intra-chain carrier transfer along conjugated polymer backbones is more efficient compared to the interchain charge hopping through $\pi$-$\pi$ stacks, even though the hopping rate could be different depending on the intermolecular distance.[27] The hole mobility of spin cast films, which is comparable to the immaturely assembled state of CP1 film, exhibited slightly smaller value than that of the midway direction ($\mu(45°)$) of the alignment direction. This was still about 1-2 orders of magnitude faster than the transverse mobility ($\mu(90°)$). To demonstrate a possible multimode switching of the aligned CP1 film, the characteristic optical gating effect of the FET device was investigated under a polarized light condition. As shown in FIG. 3f, the output dark current of the device under the gate voltage ($V_G$) of −40 V was measured first. Depending on the orientation of the polarized light illumination (7.1 mW/cm$^2$) to the aligned CP1 film, different amounts of photocurrent gain was observed. This implies that incident light can substitute the $V_G$ as an independent input signal to generate charge carriers in the transistor. The on-to-off switching ratio ($I_{on}/I_{off}$) under illumination was about 7.2×10$^4$ (FIG. 5e), which is large enough for an FET to operate as a multi-mode switch, such as electrical and optical switch.

REFERENCES

Kim, Y. et al. A strong regioregularity effect in self-organizing conjugated polymer films and high-efficiency polythiophene:fullerene solar cells. *Nat. Mater.* 5, 197 (2006).

Chen, H. -Y. et al. Polymer solar cells with enhanced open-circuit voltage and efficiency. *Nat. Photonics* 3, 649 (2009).

Park, S. H. et al. Bulk heterojunction solar cells with internal quantum efficiency approaching 100%. *Nat. Photonics* 3, 297 (2009).

Mcculloch, I. et al. Liquid-crystalline semiconducting polymers with high charge-carrier mobility. *Nat. Mater.* 5, 328 (2006).

Sirringhaus, H. et al. Two-dimensional charge transport in self-organized, high-mobility conjugated polymers. *Nature* 401, 685 (1999).

Ha, J. S., Kim, K. H. & Choi, D. H. 2,5-Bis(2-octyldodecyl)pyrrolo[3,4-c]pyrrole-1,4-(2H,5H)-dione-based donor-acceptor alternating copolymer bearing 5,5'-di(thiophen-2-yl)-2,2'-biselenophene exhibiting 1.5 cm$^2$ V$^{-1}$s$^{-1}$ hole mobility in thin-film transistors *J. Am. Chem. Soc.* 133, 10364 (2011).

Gross, M. et al. Improving the performance of doped p-conjugated polymers for use in organic light-emitting diodes. *Nature* 405, 661 (2000).

Lavastre, O., Illitchev, I., Jegou, G. & Dixneuf, P. H. Discovery of new fluorescent materials from fast synthesis and screening of conjugated polymers. *J. Am. Chem. Soc.* 124, 5278 (2002).

Thomas III, S. W., Joly, G. D. & Swager, T. M. Chemical sensors based on amplifying fluorescent conjugated polymers. *Chem. Rev.* 107, 1339 (2007).

Forzani, E. S. et al. A conducting polymer nanojunction sensor for glucose detection. *Nano Lett.* 4, 1785 (2004).

Gibbons, W. M., Shannon, P. J., Sun, S. -T. & Swetlin B. J. Surface-mediated alignment of nematic liquid crystals with polarized laser light. *Nature* 351, 49 (1991).

Grell, M. et al. A glass-forming conjugated main-chain liquid crystal polymer for polarized electroluminescence application. *Adv Mater.* 9, 798 (1997).

Grell M. et al. A. Blue polarized electroluminescence from a liquid crystalline polyfluorene. *Adv. Mater.* 11, 671 (1999).

Lee, J., Jun, H. & Kim, J. Polydiacetylene-liposome microarrays for selective and sensitive mercury(II) detection. *Adv. Mater.* 21, 3674 (2009).

Brinkmann, M, & Wittmann, J. -C. Orientation of regioregular poly(3-hexylthiophene) by directional solidification: A simple method to reveal the semicrystalline structure of a conjugated polymer. *Adv. Mater.* 18, 860 (2006).

Cimrová, V., Remmers, M., Neher, D. & Wegner, G. Polarized light emission from LEDs prepared by the langmuir-blodgett technique. *Adv. Mater.* 8, 146 (1996).

Kim, J., McHugh, S. K., & Swager, T. M. Nanoscale fibrils and grids: aggregated structures from rigid-rod conjugated polymers. *Macromolecules* 32, 1500 (1999).

Weder, C., Sarwa, C., Montali, A., Bastiaansen, C. & Smith, P. Incorporation of photoluminescent polarizers into liquid crystal displays. *Science* 279, 835 (1998).

Montali, A., Bastiaansen, C., Smith, P. & Weder, C. Polarizing energy transfer in photoluminescentmaterials for display applications. *Nature* 392, 261 (1998).

Tsao, H. N. et al. The influence of morphology on high-performance polymer field-effect transistors. *Adv. Mater.* 21, 209 (2009).

Zheng, Z. et al. Uniaxial alignment of liquid-crystalline conjugated polymers by nanoconfinement. *Nano Lett.* 7, 987 (2007).

Subramanian, S. et al. Chromophore fluorination enhances crystallization and stability of soluble anthradithiophene semiconductors. *J. Am. Chem. Soc.* 130, 2706 (2008).

Gundlach, D. J. et al. Contact-induced crystallinity for high-performance soluble acene-based transistors and circuits. *Nat. Mater.* 7, 216 (2008).

Kim, J. & Swager, T. M. Control of conformational and interpolymer effects in conjugated polymers. *Nature* 411, 1030 (2001).

Tsao, H. N. et al. Ultrahigh Mobility in Polymer Field-Effect Transistors by Design. *J. Am. Chem. Soc.* 133, 2605 (2011).

Yang, N. -J., Liao, C. -S., Chen, S. -A. Hysteresis in conjugated polymer thin film transistors generated by chain relaxation. *Adv. Funct. Mater.* 20, 1000 (2010).

Lemaur, V. et al. Charge Transport Properties in Discotic Liquid Crystals: A Quantum-Chemical Insight into Structure-Property Relationships. *J. Am. Chem. Soc.* 126, 3271 (2004)

Kline, R. J. et al. Dependence of regioregular poly(3-hexylthiophene) film morphology and field-effect mobility on molecular weight. *Macromolecules* 38, 3312 (2005).

Redecker, M., Bradley, D. D. C., Ibasekaran, M. Woo, E. P. Mobility enhancement through homogeneous nematic alignment of liquid-crystalline polyfluorene. *Appl. Phys. Lett.* 74, 1400 (1999).

EXAMPLES

Scheme 1:

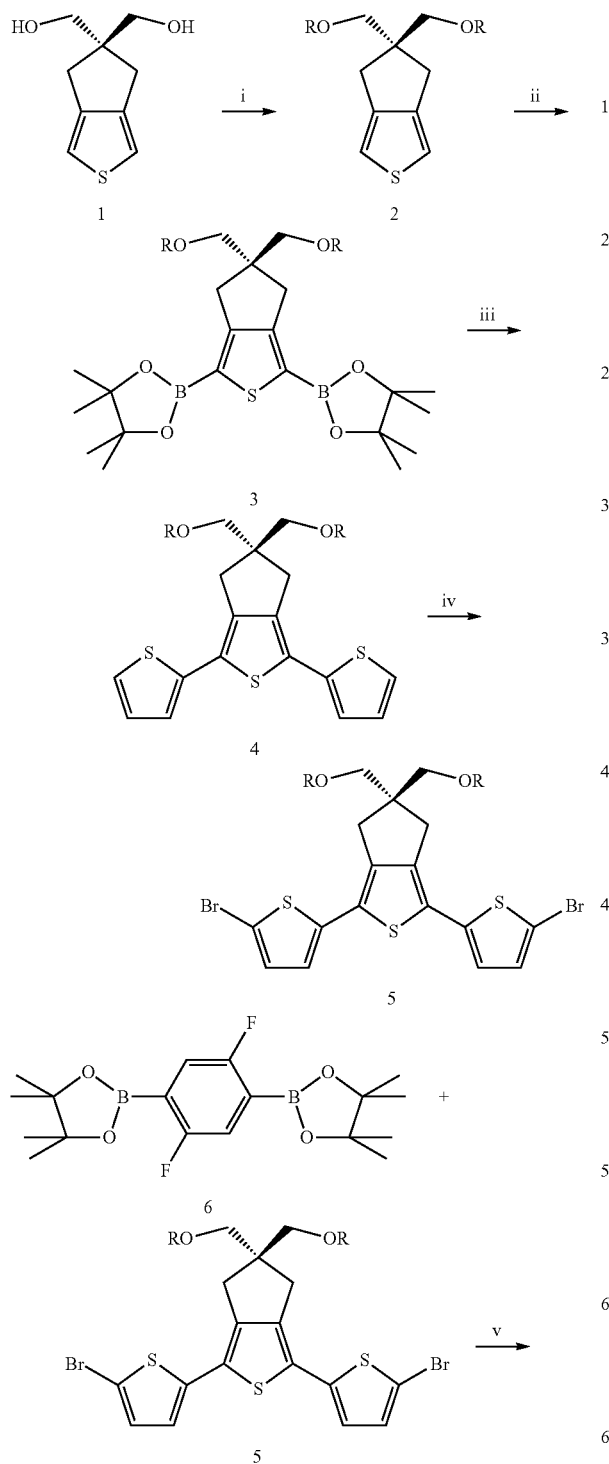

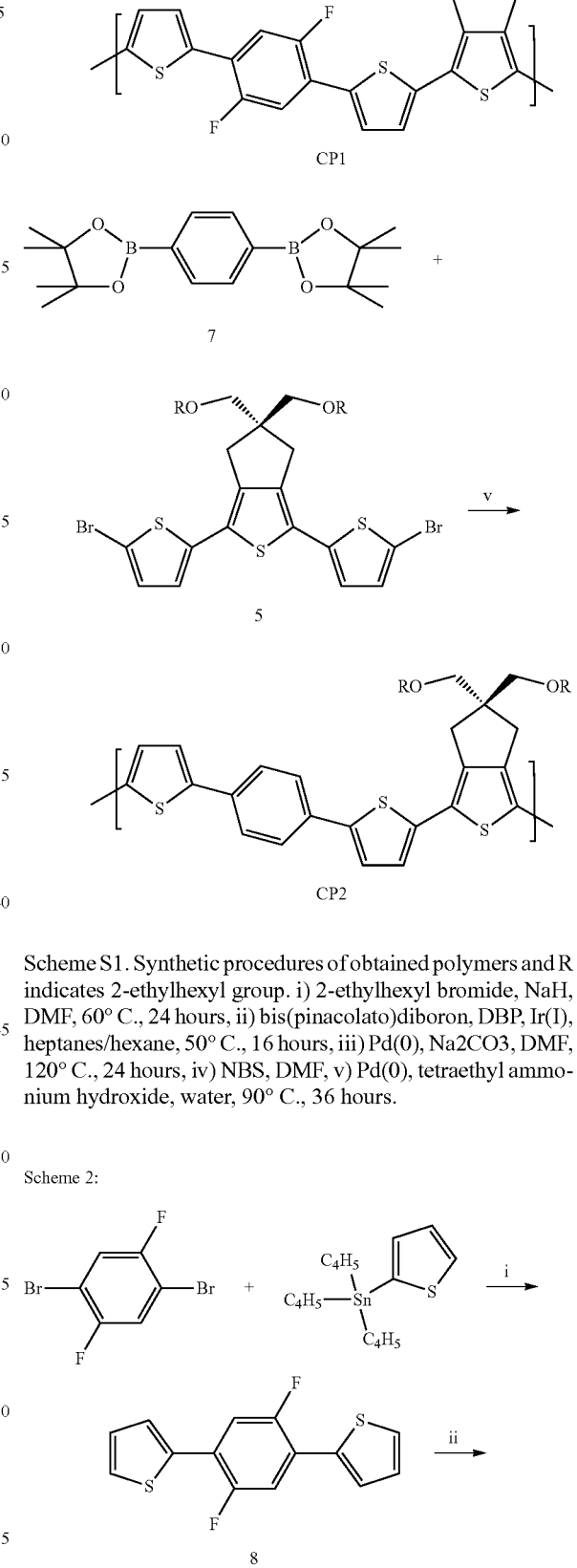

Scheme S1. Synthetic procedures of obtained polymers and R indicates 2-ethylhexyl group. i) 2-ethylhexyl bromide, NaH, DMF, 60° C., 24 hours, ii) bis(pinacolato)diboron, DBP, Ir(I), heptanes/hexane, 50° C., 16 hours, iii) Pd(0), Na2CO3, DMF, 120° C., 24 hours, iv) NBS, DMF, v) Pd(0), tetraethyl ammonium hydroxide, water, 90° C., 36 hours.

Scheme 2:

13
-continued
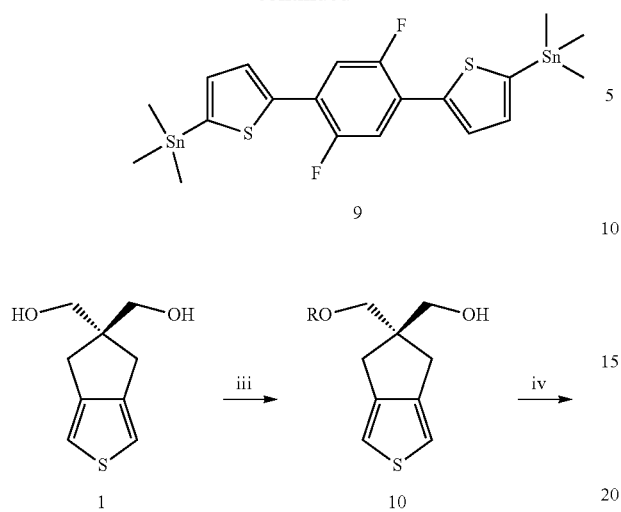
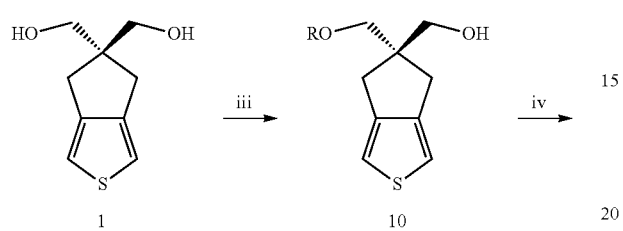
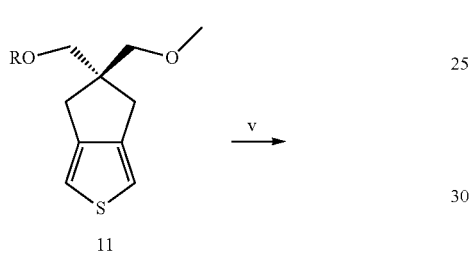
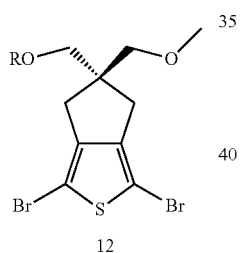
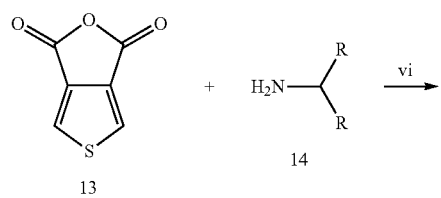
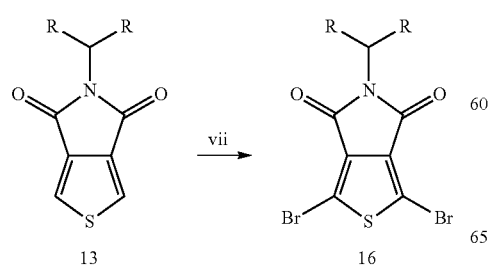
14
-continued
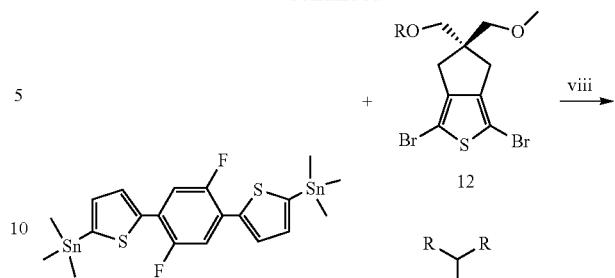
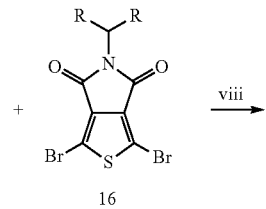
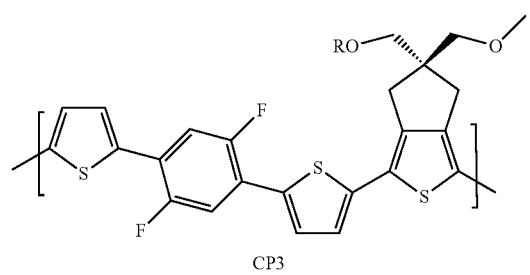
CP3
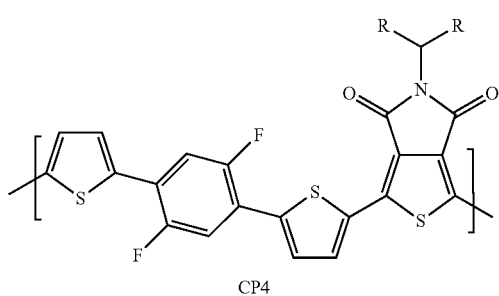
CP4
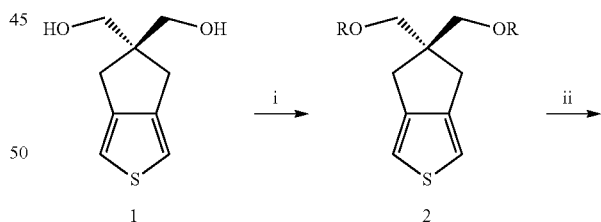
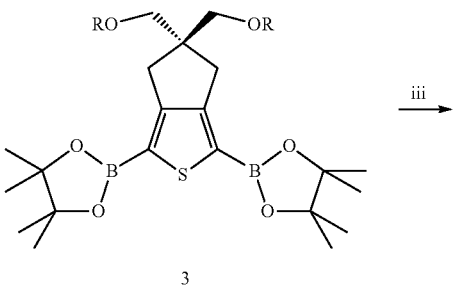

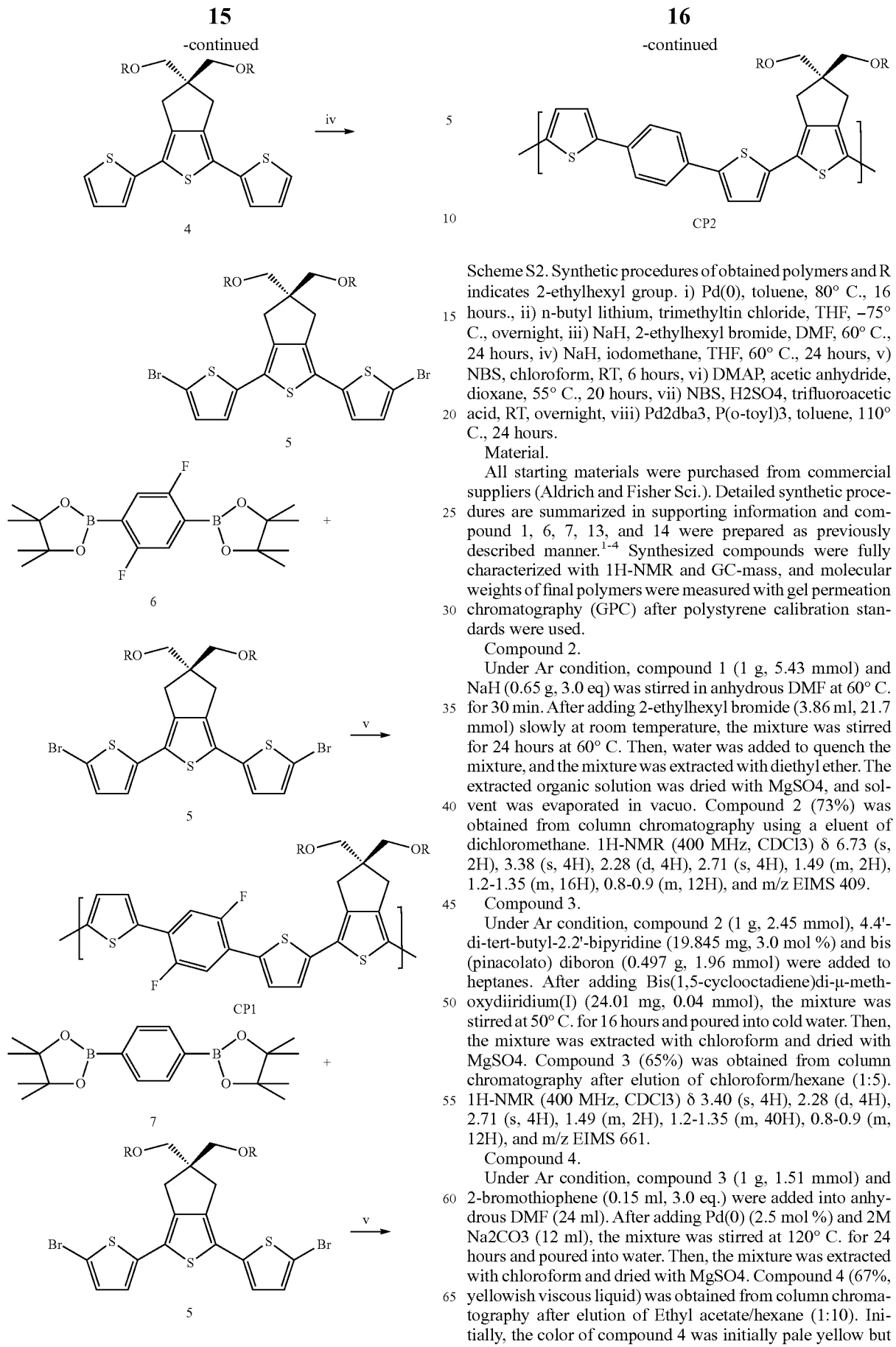

Scheme S2. Synthetic procedures of obtained polymers and R indicates 2-ethylhexyl group. i) Pd(0), toluene, 80° C., 16 hours., ii) n-butyl lithium, trimethyltin chloride, THF, −75° C., overnight, iii) NaH, 2-ethylhexyl bromide, DMF, 60° C., 24 hours, iv) NaH, iodomethane, THF, 60° C., 24 hours, v) NBS, chloroform, RT, 6 hours, vi) DMAP, acetic anhydride, dioxane, 55° C., 20 hours, vii) NBS, H2SO4, trifluoroacetic acid, RT, overnight, viii) Pd2dba3, P(o-toyl)3, toluene, 110° C., 24 hours.

Material.

All starting materials were purchased from commercial suppliers (Aldrich and Fisher Sci.). Detailed synthetic procedures are summarized in supporting information and compound 1, 6, 7, 13, and 14 were prepared as previously described manner.[1-4] Synthesized compounds were fully characterized with 1H-NMR and GC-mass, and molecular weights of final polymers were measured with gel permeation chromatography (GPC) after polystyrene calibration standards were used.

Compound 2.

Under Ar condition, compound 1 (1 g, 5.43 mmol) and NaH (0.65 g, 3.0 eq) was stirred in anhydrous DMF at 60° C. for 30 min. After adding 2-ethylhexyl bromide (3.86 ml, 21.7 mmol) slowly at room temperature, the mixture was stirred for 24 hours at 60° C. Then, water was added to quench the mixture, and the mixture was extracted with diethyl ether. The extracted organic solution was dried with MgSO4, and solvent was evaporated in vacuo. Compound 2 (73%) was obtained from column chromatography using a eluent of dichloromethane. 1H-NMR (400 MHz, CDCl3) δ 6.73 (s, 2H), 3.38 (s, 4H), 2.28 (d, 4H), 2.71 (s, 4H), 1.49 (m, 2H), 1.2-1.35 (m, 16H), 0.8-0.9 (m, 12H), and m/z EIMS 409.

Compound 3.

Under Ar condition, compound 2 (1 g, 2.45 mmol), 4.4'-di-tert-butyl-2.2'-bipyridine (19.845 mg, 3.0 mol %) and bis(pinacolato) diboron (0.497 g, 1.96 mmol) were added to heptanes. After adding Bis(1,5-cyclooctadiene)di-μ-methoxydiiridium(I) (24.01 mg, 0.04 mmol), the mixture was stirred at 50° C. for 16 hours and poured into cold water. Then, the mixture was extracted with chloroform and dried with MgSO4. Compound 3 (65%) was obtained from column chromatography after elution of chloroform/hexane (1:5). 1H-NMR (400 MHz, CDCl3) δ 3.40 (s, 4H), 2.28 (d, 4H), 2.71 (s, 4H), 1.49 (m, 2H), 1.2-1.35 (m, 40H), 0.8-0.9 (m, 12H), and m/z EIMS 661.

Compound 4.

Under Ar condition, compound 3 (1 g, 1.51 mmol) and 2-bromothiophene (0.15 ml, 3.0 eq.) were added into anhydrous DMF (24 ml). After adding Pd(0) (2.5 mol %) and 2M Na2CO3 (12 ml), the mixture was stirred at 120° C. for 24 hours and poured into water. Then, the mixture was extracted with chloroform and dried with MgSO4. Compound 4 (67%, yellowish viscous liquid) was obtained from column chromatography after elution of Ethyl acetate/hexane (1:10). Initially, the color of compound 4 was initially pale yellow but kept changing to brownish color under ambient condition. So, it was stored into freezer and used for next reaction. 1H-NMR (400 MHz, CDCl3) δ 7.21 (d, 2H), 7.14 (d, 2H), 7.04 (m, 2H), 3.42 (s, 4H), 3.32 (d, 4H), 2.75 (s, 4H), 1.52 (m, 2H), 1.2-1.40 (m, 16H), 0.8-0.9 (m, 12H), and m/z EIMS 574.

Compound 5.

Under dark condition, compound 4 (0.5 g, 0.87 mmol) was dissolved into chloroform, and 2.0 equivalent of NBS diluted into chloroform was slowly added under ice bath. Then, the mixture was warmed up to room temperature and stirred for 6 hours. After adding water to the mixture, the organic layer was separated and dried with MgSO4. Compound 5 (88%, yellowish viscous liquid) was obtained from column chromatography after elution of ethyl acetate/hexane (1:10) and it was also stored into freezer and used for next reaction. 1H-NMR (400 MHz, CDCl3) δ 7.02 (d, 2H), 7.94 (d, 2H), 3.38 (s, 4H), 3.30 (d, 4H), 2.77 (s, 4H), 1.52 (q, 2H), 1.2-1.40 (m, 16H), 0.8-0.9 (m, 12H), and m/z EIMS 731.

General Procedure of Suzuki Type Polymerization (CP1 and CP2).

Under inert conditions (Ar), monomers containing dibor-onester unit (compound 6 and compound 7) was dissolved into toluene, and the equivalent amount of corresponding monomer (compound 5) was mixed. After adding 5 mol % of tetrakis(triphenylphosphine) palladium(0) and 1.8 ml of tetraethyl ammonium hydroxide (20% solution) to the 1 mmol of compound 5, the mixture was stirred at 95° C. for 24 hours. Bromobenzene (24 μm) and benzene boronic acid (26 mg) were added respectively, to the mixture for chain end modification. The final polymer was collected via reprecipitation into methanol. The solid was collected through 0.45 μm nylon filter and washed with methanol and acetone in a soxhlet apparatus to remove the oligomers and catalyst residue. After dissolving obtained polymer into chloroform, the polymer solution was eluted through a column packed with Cellite and Florosil. Then, the solution was concentrated and reprecipitated from methanol again. CP1 (Mn:22000, Mw: 35000, and PDI: 1.6) and CP2 (Mn: 20000, Mw: 36000, and PDI: 1.8).

Compound 8.

Under Ar condition, 1,4-dibromo-2,5-difluorobenzene (1 g, 3.68 mmol) and 2-tributylstannyl thiophene (3.5 ml, 3.0 eq) were dissolved in anhydrous toluene. After adding tetrakis (triphenylphosphine)palladium(0) (0.21 g, 5 mol %), the mixture was heated up to 80° C. for 16 hours. Then, the mixture was poured into water and extracted with chloroform. The organic layer was dried with MgSO4, and target compound (56%) was obtained from column chromatography after elution with dichlromethane/n-hexane (1/2). 1H-NMR (400 MHz, CDCl3) δ 7.55 (d, 2H), 7.43 (m, 4H), 7.17 (t, 2H), and m/z EIMS 278.

Compound 9.

Under Ar condition, compound 8 (1 g, 3.59 mmol) was dissolved into anhydrous THF. At −75° C., n-butyl lithium (3.0 ml, 2.5 M solution in heptane) was added dropwise and the mixture was stirred for 30 minutes. Then, the mixture was warmed up to room temperature and additionally stirred for 1 hour. After cooling again the mixture to −75° C., trimethyltin chloride (7.54 ml, 1.0M solution in THF) was added and stirred overnight under room temperature. Then, the mixture was poured into water and extracted with dichloromethane. The organic layer was dried with MgSO4, and target compound (75%) was finally obtained through recrystallization from dichloromethane/n-hexane. 1H-NMR (400 MHz, CDCl3) δ 7.61 (d, 2H), 7.42 (t, 2H), 7.22 (dt, 2H), 0.42 (sp, 18H), and m/z EIMS 604.

Compound 10.

Under Ar condition, compound 1 (0.9 g, 4.88 mmol) and NaH (0.23 g, 1.2 eq) was suspended in anhydrous DMF at room temperature, and the mixture was heated up to 60° C. for 30 min. After adding 2-ethylhexyl bromide (1.04 ml, 5.86 mmol) slowly, the mixture was stirred for 24 hours at 60° C. Then, water was added to quench the mixture, and the mixture was extracted with diethyl ether. The extracted organic solution was dried with MgSO4, and solvent was evaporated in vacuo. Compound 10 (52%) was obtained from column chromatography using a eluent of dichloromethane/n-hexane. 1H-NMR (400 MHz, CDCl3) δ 6.79 (s, 2H), 3.70 (d, 2H), 3.55 (s, 2H), 3.34 (d, 2H), 3.02 (t, 1H), 2.68 (d, 2H), 2.58 (d, 2H), 1.54 (m, 1H), 1.28-1.35 (m, 10H), 0.89-0.92 (m, 6H), and m/z EIMS 296.

Compound 11.

Under Ar condition, compound 10 (1 g, 3.37 mmol) and NaH (0.26 g, 2.0 eq) was suspended in anhydrous THF at room temperature, and the mixture was heated up to 60° C. for 30 min. After adding iodomethane (0.634 ml, 5.0 eq) slowly, the mixture was stirred for 24 hours at 60° C. Then, water was added to quench the mixture, and the mixture was extracted with diethyl ether. The extracted organic solution was dried with MgSO4, and solvent was evaporated in vacuo. Compound 11 (84%) was obtained from column chromatography using a eluent of dichloromethane/n-hexane. 1H-NMR (400 MHz, CDCl3) δ 6.75 (s, 2H), 3.37-3.35 (m, 7H), 3.30 (d, 2H), 2.60 (dt, 4H), 1.49 (m, 1H), 1.28-1.35 (m, 10H), 0.89-0.92 (m, 6H), and m/z EIMS 310.

Compound 12.

Under dark condition, compound 11 (3.37 mmol) was dissolved into chloroform, and 2.3 equivalent of NBS (1.38 g, 7.75 mmol) was slowly added under ice bath. Then, the mixture was warmed up to room temperature and stirred for 6 hours. After adding water to the mixture, the organic layer was separated and dried with MgSO4. Compound 12 (98%) was obtained from column chromatography after elution of dichloromethane/n-hexane. 1H-NMR (400 MHz, CDCl3) δ 3.35 (m, 5H), 3.31 (d, 4H), 2.55 (s, 4H), 1.50 (m, 1H), 1.28-1.35 (m, 10H), 0.89-0.92 (t, 6H), and m/z EIMS 468.

Compound 15.

Compound 13 (1 g, 6.5 mmol) and compound 14 (1.32 g, 0.8 eq) were dissolved into anhydrous dioxane (30 ml). After adding DMAP (0.97 g, 7.89 mmol) to the mixture, it was stirred for 20 hours at 55° C. Then, acetic anhydride (20 ml) was added to the mixture, and it was heated up to 80° C. After additionally stirring for 4 hours, the mixture was poured into water and extracted with dichloromethane. The organic layer was separated and dried with MgSO4. Compound 15 (66%) was obtained from column chromatography after elution of dichloromethane/n-hexane. 1H-NMR (400 MHz, CDCl3) δ 7.80 (s, 2H), 4.35 (m, 1H), 2.05 (m, 2H), 1.57-1.12 (m, 19H), 0.92-0.79 (m, 12H), and m/z EIMS 391.

Compound 16.

Compound 15 (1 g, 2.55 mmol) was dissolved into a mixture of H2SO4 (3.82 ml) and trifluoroacetic acid (12.5 ml). NBS (1.4 g, 7.5 mmol) was added in five portions to the solution and the mixture was stirred overnight at room temperature. The resulted brown-red solution was diluted with water and extracted with dichloromethane. The organic layer was separated and dried with MgSO4. Compound 15 (78%) was obtained from column chromatography after elution of dichloromethane/n-hexane (1/1). 1H-NMR (400 MHz, CDCl3) δ 4.32 (m, 1H), 2.00 (m, 2H), 1.57-1.12 (m, 19H), 0.92-0.79 (m, 12H), and m/z EIMS 549.

General Procedure of Stille Type Polymerization.

Under inert conditions (Ar), compound 9 was dissolved into anhydrous toluene, and the equivalent amount of corresponding monomers (compound 12 or compound 16) was mixed. After adding 5 mol % of Pd2dba3 and P(o-toyl)3 (3.5 eq to Pd(0)) were added to the mixture, and it was stirred for 24 hours at 110° C. Then, 2-tributylstannyl thiophene (39.5 µl) and 2-bromothiophene (12.5 µl) were added 3 hours intervals one after the other both for the termination of polymerization and chain end modification. The final polymers were collected via reprecipitation into methanol and the solid was collected through 0.45 µm nylon filter. After washing the collected solid with methanol and acetone in a soxhlet apparatus to remove the oligomers and catalyst residue, soluble part to chloroform was only obtained for next characterization. Then, the polymer solution was eluted through a column packed with Cellite/Florosil, and obtained solution was reprecipitated from methanol after concentration in vacuo. CP3 (Mn: 4437, Mw: 7444, and PDI:1.68) and CP4 (Mn: 33800, Mw: 65600, and PDI:1.94).

Grazing Incident X-Ray Diffraction (GIXD).

GIXD was performed on beamline 4C2 (incident angle: 0.2°) at the Pohang Accelerator Laboratory (PAL). The samples were mounted on an X and Y axes goniometer, and monochromatized X-rays ($\lambda$=0.1608 nm) under vacuum was used. The scattered beam intensity was recorded with an SCX 4300-165/2 CCD detector (1242×1152 pixels, Princeton Instruments). The diffraction intensity plots of the 2D GIXD patterns were obtained using SAXS_FIT2D software provided by the European Synchrotron Radiation Facility.

Contact Coating

After cleaning substrate, it was placed on top of hot stage. The gap between the substrate and coating unit was controlled from 25 µm to 100 µm with standard polyimide film including micro-gauge. Dilute polymer solutions (10 mg in 4 ml of o-dichlorobenzene) containing additive (5 vol %, 1,8-diiodooctane or 1,8-octanedithiol) were spread onto the substrate. Then, the coating unit, silicon blade, was adjusted to the edge of polymer solution, which makes polymer solution spread along silicon blade. The coating unit was operated under heating (140° C.), and the maximum process window of our coating machine is about 1.5 inch (length)×1.0 inch (width). The schematic diagram of a contact type coater is illustrated in FIG. 6.

Organic Field-Effect Transistor (OFET) Device

Bottom-gate, top-contact field effect transistors were fabricated to characterize electrical properties of obtained polymer films. After cleaning the silicon wafer in a Piranha solution, phenyltrichlorosilane (PTS, water contact angle; 72°) was treated on thermally grown oxide surface (260 nm) and polymer films (80 nm) were prepared by means of contact or spin coating methods. Then, source and drain electrodes (Au, 100 nm) were then thermally evaporated through shadow mask with channel width and length of 200 µm, and 100 µm, respectively. The field effect mobility was extracted from the saturation regime using the relationship, $\mu(sat)=(2I_{DS} \cdot L)/(W \cdot C \cdot (V_G-Vth)^2)$, where $I_{DS}$ is saturation drain current, C is capacitance (11 nF cm$^2$) of dielectric layer (SiO$_2$), VG is gate voltage, and Vth implies threshold voltage. The device performance was evaluated in air using Keithley 4200-SCS semiconductor analyzer.

REFERENCES

Loewe, R. S. et al. Synthesis of perylene-porphyrin building blocks and rod-like oligomers for light-harvesting applications. *J. Mater. Chem.*, 12, 3438 (2002).

Iovine, P. M., Kellett, M. A., Redmore, N. P. & Therien, M. J. Syntheses and 1H NMR spectroscopy of rigid, cofacially aligned, porphyrin-bridge-quinone systems in which the interplanar separations between the porphyrin, aromatic bridge, and quinine are less than the sum of their respective van der Waals Radii *J. Am. Chem. Soc.* 122, 8717 (2000).

Nielsen, C. B. & Bjornholm, T. New regiosymmetrical dioxopyrroloand dihydropyrrolo-functionalized polythiophenes. *Org. Lett.* 6, 3381 (2004).

Zhou, E. et al. Synthesis and photovoltaic properties of a novel low band gap polymer based on N-substituted dithieno[3,2-b:2',3'-d]pyrrole. *Macromolecules* 41, 8302 (2008).

What is claimed is:

1. A conductive polymer comprising an aromatic repeating unit, the repeating unit comprising:
    a) an aromatic π-conjugated backbone comprising three or four aromatic rings, and further comprising at least one sulfur atom and at least one fluorine atom, the sulfur and fluorine atoms being located on adjacent aromatic rings and separated by three carbon atoms of the π-conjugated backbone;
    b) an aliphatic ring fused to at least one of the aromatic rings of the repeating unit;
    c) two side chains connected to an sp$^3$ carbon of the fused aliphatic ring, wherein the side chains are aliphatic and have 4 or more non-hydrogen atoms.

2. The conductive polymer according to claim 1, wherein the conjugated backbone comprises at least one thiophene ring.

3. The conductive polymer according to claim 1, wherein the conjugated backbone comprises at least one aryl ring.

4. The conductive polymer according to claim 1, wherein the repeating unit comprises 3 aromatic rings.

5. The conductive polymer according to claim 1, wherein the repeating unit comprises 4 aromatic rings.

6. The conductive polymer according to claim 1, wherein the side chains are independently selected from $C_4$-$C_{20}$ alkyl; $C_4$-$C_{20}$ alkyl substituted with one or more groups selected from oxo, oxa, and hydroxyl; $C_4$-$C_{20}$ alkenyl, $C_4$-$C_{20}$ alkenyl substituted with one or more groups selected from oxo, oxa, and hydroxyl; $C_4$-$C_{20}$ alkynyl; and $C_4$-$C_{20}$ alkynyl substituted with one or more groups selected from oxo, oxa, and hydroxyl.

7. The conductive polymer according to claim 6, wherein the side chains are independently selected from $C_4$-$C_{12}$ alkyl; $C_4$-$C_{12}$ alkyl substituted with one or more groups selected from oxo, oxa, and hydroxyl; $C_4$-$C_{12}$ alkenyl; $C_4$-$C_{12}$ alkenyl substituted with one or more groups selected from oxo, oxa, and hydroxyl; $C_4$-$C_{12}$ alkynyl; and $C_4$-$C_{12}$ alkynyl substituted with one or more groups selected from oxo, oxa, and hydroxyl.

8. The conductive polymer according to claim 2, wherein the conjugated backbone further comprises a fluorine-substituted phenyl ring.

9. The conductive polymer according to claim 8, wherein the conjugated backbone comprises two thiophene rings and a phenyl ring substituted with two fluorine atoms.

10. An electroconductive polymer film comprising the conductive polymer of claim 1.

11. A light emitting diode comprising the electroconductive polymer film according to claim 10.

12. A field effect transistor comprising the electroconductive polymer film according to claim 10.

13. A thin film transistor comprising the electroconductive polymer film according to claim 10.

14. An organic solar cell comprising the electroconductive polymer film according to claim 10.

15. An optical sensor comprising the electroconductive polymer film according to claim 10.

16. An amperometric sensor comprising the electroconductive polymer film according to claim 10.

17. A conductive polymer comprising a repeating unit of the structure

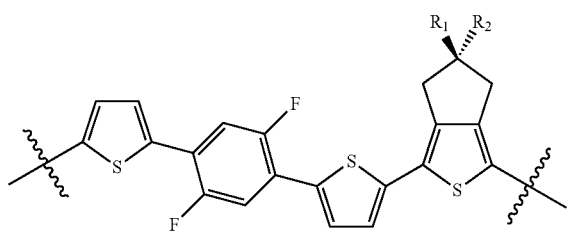

wherein $R_1$ and $R_2$ are aliphatic groups containing 4 or more non-hydrogen atoms.

18. The conductive polymer according to claim 17, wherein $R_1$ and $R_2$ are independently selected from $C_4$-$C_{20}$ alkyl, $C_4$-$C_{20}$ alkyl substituted with one or more groups selected from oxo, oxa, and hydroxyl; $C_4$-$C_{20}$ alkenyl, $C_4$-$C_{20}$ alkenyl substituted with one or more groups selected from oxo, oxa, and hydroxyl; $C_4$-$C_{20}$ alkynyl, $C_4$-$C_{20}$ alkynyl substituted with one or more groups selected from oxo, oxa, and hydroxyl.

19. The conductive polymer according to claim 18, wherein $R_1$ and $R_2$ are independently selected from $C_4$-$C_{12}$ alkyl; $C_4$-$C_{12}$ alkyl substituted with one or more groups selected from oxo, oxa, and hydroxyl; $C_4$-$C_{12}$ alkenyl; $C_4$-$C_{12}$ alkenyl substituted with one or more groups selected from oxo, oxa, and hydroxyl; $C_4$-$C_{12}$ alkynyl; and $C_4$-$C_{12}$ alkynyl substituted with one or more groups selected from oxo, oxa, and hydroxyl.

20. The conductive polymer according to claim 18, wherein $R_1$ and $R_2$ are (2-ethylhexyloxy)methyl.

* * * * *